(12) United States Patent
Liu et al.

(10) Patent No.: US 9,395,627 B2
(45) Date of Patent: Jul. 19, 2016

(54) POSITIVE PHOTOSENSITIVE RESIN COMPOSITION AND METHOD FOR FORMING PATTERN BY USING THE SAME

(71) Applicant: CHI MEI CORPORATION, Tainan (TW)

(72) Inventors: Chi-Ming Liu, Kaohsiung (TW); Chun-An Shih, Tainan (TW)

(73) Assignee: CHI MEI CORPORATION, Tainan (*) Notice: Subject to any disclaimer, the term of this patent is extended or adjusted under 35 U.S.C. 154(b) by 0 days.

(21) Appl. No.: 14/475,589

(22) Filed: Sep. 3, 2014

(65) Prior Publication Data

US 2015/0072275 A1   Mar. 12, 2015

(30) Foreign Application Priority Data

Sep. 10, 2013   (TW) .............................. 102132614 A

(51) Int. Cl.
  *G03F 7/075*   (2006.01)
  *G03F 7/20*    (2006.01)
  *G03F 7/023*   (2006.01)

(52) U.S. Cl.
  CPC ............ *G03F 7/0757* (2013.01); *G03F 7/0233* (2013.01); *G03F 7/0236* (2013.01)

(58) Field of Classification Search
  CPC ....... G03F 7/004; G03F 7/039; G03F 7/0757; G03F 7/20
  See application file for complete search history.

(56) References Cited

U.S. PATENT DOCUMENTS

| 6,356,676 | B1* | 3/2002 | Herron et al. .................... 385/12 |
| 6,893,908 | B2* | 5/2005 | You et al. ....................... 438/155 |
| 7,008,883 | B2* | 3/2006 | Kashiwagi et al. ............ 438/780 |
| 2001/0004535 | A1* | 6/2001 | Kim et al. ........................ 438/30 |
| 2007/0042296 | A1* | 2/2007 | Sasaki et al. ............... 430/281.1 |

FOREIGN PATENT DOCUMENTS

| JP | 63-313149 A | * | 12/1988 |
| JP | 63-313149 A |   | 12/1988 |
| JP | 2001-506295 A |   | 5/2001 |
| JP | 2005-107131 A |   | 4/2005 |
| JP | 2005-292776 A |   | 10/2005 |
| JP | 2008-107529 | * | 5/2008 |
| JP | 2009-151266 A |   | 7/2009 |
| JP | 2010-20291 A |   | 1/2010 |
| JP | 2010-39270 A |   | 2/2010 |
| TW | 477915 B |   | 3/2002 |
| TW | 200705107 |   | 2/2007 |
| TW | 201232178 A |   | 8/2012 |

OTHER PUBLICATIONS

Machine translation of JP 2009-151266, published on Jul. 9, 2009.*
Machine translation of JP 2008-107529, published on May 8, 2008.*
Translation of JP 63-313149A, published on Dec. 21, 1988.*

* cited by examiner

*Primary Examiner* — Anca Eoff
(74) *Attorney, Agent, or Firm* — CKC & Partners Co., Ltd.

(57) ABSTRACT

The present invention relates to a positive photosensitive resin composition and a method for forming a pattern by using the same. The positive photosensitive resin composition includes a novolac resin (A), a polysiloxane (B), an ortho-naphthoquinone diazide sulfonic acid ester (C) and a solvent (D). The novolac resin (A) includes a xylenol-type novolac resin (A-1). The xylenol-type novolac resin (A-1) is synthesized by polycondensing an aldehyde compound with a xylenol compound.

12 Claims, 2 Drawing Sheets

POSITIVE PHOTOSENSITIVE RESIN COMPOSITION AND METHOD FOR FORMING PATTERN BY USING THE SAME

RELATED APPLICATIONS

This application claims priority to Taiwan Application Serial Number 102132614, filed Sep. 10, 2013, which is herein incorporated by reference.

BACKGROUND

1. Field of Invention

The present invention relates to a positive photosensitive resin composition and a method for forming a pattern by using the same. More particularly, the present invention relates to a positive photosensitive resin composition and a method for forming a pattern by using the same, which has a good stripping ability and a good cross section shape of the pattern, is applied in semiconductor integrated circuit elements, liquid crystal display elements of thin-film transistors, or a manufacturing process of touch panels.

2. Description of Related Art

As the miniaturization of electronic products, our daily lives have been filled with various smart phones, flat-panel televisions, and high-performance microprocessors. As such, the photolithography process is getting more and more sophisticated, and the linewidth formed is also getting narrow.

Concerning different requirements on the photoresists, Japanese Laid-open Patent Application No. 2010-20291 discloses a positive photosensitive resin composition. The positive photosensitive resin composition includes an alkali-soluble resin, a quinone diazide compound, a curing agent, and an organic solvent. The alkali-soluble resin may include acryloyl copolymer and novolac resin. The acryloyl copolymer is synthesized by performing a free radical polymerization to unsaturated olefinically compound and unsaturated carboxylic acid monomers in the presence of a solvent and a polymerization initiator. The novolac resin is formed by performing a reaction to a phenol compound and an aldehyde compound or a ketone compound in the presence of an acidic catalyst. The alkali-soluble resin can improve the heat resistance of the positive photosensitive resin composition.

Moreover, Japanese Laid-open Patent Application No. 2010-39270 discloses a positive photosensitive resin composition. The positive photosensitive resin composition includes a polymer, a quinone diazide compound, a cross-linker, and a solvent. The polymer includes a compound having a structure of formula (VIII), an acrylate compound, and a phenolic hydroxyl compound, and the polymer includes 1 wt % to 50 wt % of the compound having the structure of formula (VIII). When the amount of the compound having the structure of formula (VIII) is 1 wt % to 50 wt %, the positive photosensitive resin compound has good adhesive property and tightness.

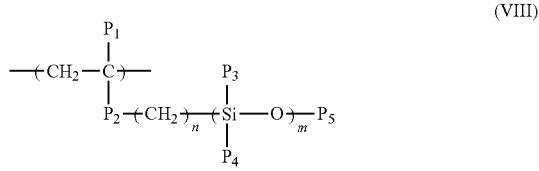

(VIII)

In formula (VIII), $P_1$ represents a hydrogen atom or a methyl group; $P_2$ represents a phenylene group or —COO—; $P_3$ and $P_4$ independently represent a phenyl group, an alkyl group of 1 to 6 carbons, or an alkoxy group of 1 to 6 carbons; $P_5$ represents an alkyl group of 1 to 6 carbons; n represents an integer of 0 to 3; and m represents an integer of 1 to 10.

However, the stripping ability and the cross section shape of patterns of conventional techniques cannot meet the requirements of the industry.

In view of the aforesaid, there is still a need to develop a positive photosensitive resin compound having good stripping ability and cross section shape of patterns to solve the problems in the prior art.

SUMMARY

Therefore, an aspect of the present invention provides a positive photosensitive resin composition, and the positive photosensitive resin composition has a good stripping ability and a good cross section shape of a pattern.

An another aspect of the present invention provides a method for forming a pattern, which is formed by the aforementioned positive photosensitive resin composition.

An another aspect of the present invention provides a thin-film transistor array substrate, which includes the pattern formed by the aforementioned method.

A further another aspect of the present invention provides a liquid crystal display element, which includes the aforementioned thin-film transistor array substrate.

According to the aforementioned aspects of the present invention, a positive photosensitive resin composition is provided, and the positive photosensitive resin composition includes a novolac resin (A), a polysiloxane (B), an ortho-naphthoquinone diazide sulfonic acid ester (C), and a solvent (D), which will be described in details hereinafter.

Novolac Resin (A)

The novolac resin (A) of the present invention includes a xylenol-type novolac resin (A-1) and an other novolac resin (A-2).

Xylenol-Type Novolac Resin (A-1)

The xylenol-type novolac resin (A-1) is formed by polycondensing an aldehyde compound with an aromatic hydroxy compound in the presence of an acidic catalyst. The aromatic hydroxy compound at least comprises a xylenol compound.

Examples of the aforementioned aldehyde compound include: formaldehyde, paraformaldehyde, trioxane, acetaldehyde, propionaldehyde, butyraldehyde, trimethylacetaldehyde, acrolein, crotonaldehyde, cyclo hexanealdehyde, furfural, furylacrolein, benzaldehyde, terephthal aldehyde, phenylacetaldehyde, α-phenylpropionaldehyde, β-phenylpropionaldehyde, o-tolualdehyde, m-tolualdehyde, p-tolualdehyde, o-chlorobenzaldehyde, m-chlorobenzaldehyde, p-chlorobenzaldehyde, cinnamaldehyde and the like. The aforementioned aldehyde compounds may be used alone or in combination of two or more.

Preferably, the aldehyde compound may be formaldehyde or benzaldehyde. Examples of the aforementioned aromatic hydroxy compound include: phenol; a cresol compound, such as m-cresol, p-cresol, o-cresol and the like; a xylenol compound, such as 2,3-xylenol, 2,5-xylenol, 3,5-xylenol, 3,4-xylenol and the like; an alkyl phenol compound, such as m-ethylphenol, p-ethylphenol, o-ethylphenol, 2,3,5-trimethylphenol, 2,3,5-triethylphenol, 4-tert-butylphenol, 3-tert-butylphenol, 2-tert-butylphenol, 2-tert-butyl-4-methylphenol, 2-tert-butyl-5-methylphenol, 6-tert-butyl-3-methylphenol and the like; an alkoxy phenol compound, such as p-methoxyphenol, m-methoxyphenol, p-ethoxyphenol, m-ethoxyphenol, p-propoxyphenol, m-propoxyphenol and the like; an isopropenyl phenol compound, such as o-isopropenyl phenol, p-isopropenyl phenol, 2-methyl-4-isopropenyl phenol, 2-ethyl-4-isopropenyl phenol and the like; an aryl phenol compound, such as phenyl phenol; a polyhydroxyphenol compound, such as 4,4'-dihydroxybiphenyl, bisphenol A, resorcinol, hydroquinone, pyrogallol and the like. The aromatic hydroxy compounds may be used alone or in combination of two or more.

Preferably, the aromatic hydroxy compound may be 3,5-xylenol, 3,4-xylenol, 2,5-xylenol, o-cresol, m-cresol, or p-cresol.

In the xylenol-type novolac resin (A-1), based on the aromatic hydroxy compound as 1 mole, the amount of the xylenol compound is 0.05 moles to 0.2 moles, preferably is 0.06 moles to 0.18 moles, and more preferably is 0.07 moles to 0.15 moles.

Examples of the aforementioned acidic catalyst include: hydrochloric acid, sulfuric acid, formic acid, acetic acid, oxalic acid, p-toluenesulfonic acid and the like.

The xylenol-type novolac resin (A-1) may be used alone or in combination of two or more.

Based on the novolac resin (A) as 100 parts by weight, the amount of the xylenol-type novolac resin (A-1) is 0 part by weight to 50 parts by weight, preferably is 2 parts by weight to 50 parts by weight, and more preferably is 5 parts by weight to 40 parts by weight.

When the novolac resin (A) includes the xylenol-type novolac resin (A-1), the obtained positive photosensitive resin composition has a good cross section shape of the pattern.

Other Novolac Resin (A-2)

The aforementioned other novolac resin (A-2) is formed by polycondensing the aforementioned aldehyde compound with the aforementioned aromatic hydroxy compound in the presence of the aforementioned acidic catalyst, but the aromatic hydroxy compound does not include xylenol compound.

Preferably, the aldehyde compound may be formaldehyde or benzaldehyde, and the aromatic hydroxy compound may be o-cresol, m-cresol, or p-cresol.

Based on the novolac resin (A) as 100 parts by weight, the amount of the other novolac resin (A-2) is 50 parts by weight to 100 parts by weight, preferably is 55 parts by weight to 98 parts by weight, and more preferably is 60 parts by weight to 95 parts by weight.

The aforementioned other novolac resin (A-2) may be used alone or in combination of two or more.

If the positive photosensitive resin composition of the present invention does not include the novolac resin (A), the obtained positive photosensitive resin composition has defects of a poor stripping ability and a poor cross section shape of the pattern.

Polysiloxane (B)

The polysiloxane (B) of the present invention may be formed by subjecting a silane monomer, a siloxane prepolymer to a combination thereof to a polymerization, that is to say a hydrolysis and a partially condensation.

The polysiloxane (B) of the present invention may be polymerizing a compound having a structure of formula (I):

In formula (I), $R_1$ may represent a hydrogen atom, an alkyl group of 1 to 10 carbons, an alkenyl group of 2 to 10 carbons, an aromatic group of 6 to 15 carbons, an alkyl group having an anhydride group, an alkyl group having an epoxy group, or an alkoxy group having an epoxy group; $R_2$ may represent a hydrogen atom, an alkyl group of 1 to 6 carbons, an acyl group of 1 to 6 carbons, or an aromatic group of 6 to 15 carbons; a may represent an integer of 0 to 3.

When the aforementioned $R_1$ represents an alkyl group of 1 to 10 carbons, $R_1$ may be methyl, ethyl, n-propyl, isopropyl, n-butyl, tert-butyl, n-hexyl, or n-decyl. $R_1$ may also represent an alkyl group having other substituents, such as trifluoromethyl, 3,3,3-trifluoropropyl, 3-aminopropyl, 3-mercaptopropyl, or 3-isocyanatopropyl.

When the aforementioned $R_1$ is an alkenyl group of 2 to 10 carbons, $R_1$ may be a vinyl group. $R_1$ may also be an alkenyl group having other substituents, such as 3-acryloxypropyl or 3-methylacryloxypropyl.

When $R_1$ represents an aromatic group of 6 to 15 carbons, $R_1$ may be phenyl, tolyl, or naphthyl. $R_1$ may also be an aromatic group having other substituents, such as o-hydroxyphenyl, 1-(o-hydroxyphenyl)ethyl, 2-(o-hydroxyphenyl)ethyl, or 4-hydroxy-5-(p-hydroxyphenylcarbonyloxy)pentyl.

When $R_1$ represents an alkyl group having an anhydride group, the numbers of carbon atoms of the alkyl group are preferably 1 to 10. $R_1$ may have a structure of the following formulas (II)-(IV):

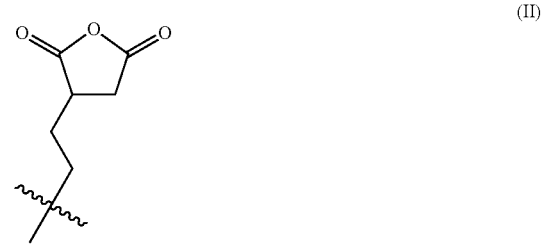

(II)

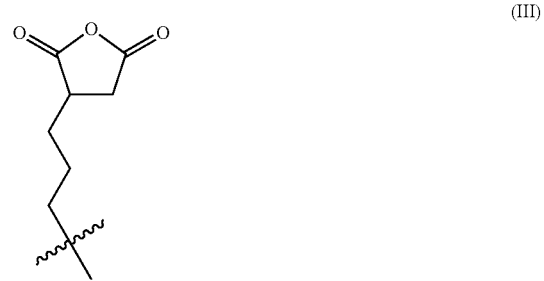

(III)

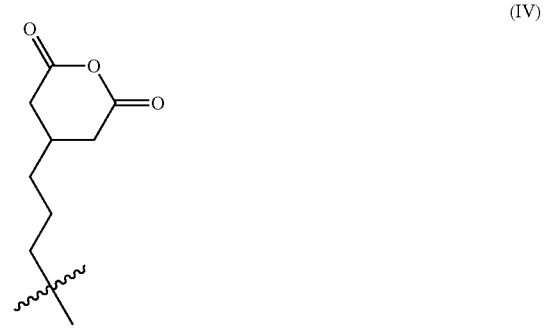

(IV)

The aforementioned anhydride group is a functional group formed by subjecting an intramolecular dehydration to a dicarboxylic acid compound. The dicarboxylic acid compound may be succinic acid or glutaric acid.

When $R_1$ represents an alkyl group having an epoxy group, the numbers of carbons of the alkyl group is preferably 1 to 10. Examples of the alkyl group having an epoxy group include: oxetanylpentyl or 2-(3,4-epoxycyclohexyl)ethyl.

The aforementioned epoxy group is a functional group formed by subjecting a diol to an intramolecular dehydration. The diol may be propanediol, butanediol, or pentanediol.

When $R_1$ represents an alkoxy group having an epoxy group, the numbers of carbons of the alkoxy group is preferably 1 to 10. Examples of the alkoxy group having an epoxy group include: glycidoxypropyl or 2-oxetanylbutoxy.

If at least one of the aforementioned $R_1$ in the formula (I) includes an alkyl group having an anhydride group, an alkyl group having an epoxy group, or an alkoxy group having an epoxy group, the obtained positive photosensitive resin composition will have a better stripping ability.

When $R_2$ represents an alkyl group of 1 to 6 carbons, $R_2$ may be methyl, ethyl, n-propyl, isopropyl, or n-butyl. When $R_2$ represents an acyl group of 1 to 6 carbons, $R_2$ may be a phenyl group.

In formula (I), a may represent an integer of 0 to 3. When a represents 2 or 3, a plurality of $R_1$ may be the same or different. When a represents 1 or 2, a plurality of $R_2$ may be the same or different.

When the aforementioned a is 0, the silane monomer in formula (I) represents a tetrafunctional silane monomer, that is to say the silane monomer includes four hydrolyzable groups; when a is 1, the silane monomer in formula (I) represents a trifunctional silane monomer, that is to say the silane monomer includes three hydrolyzable groups; when a is 2, the silane monomer in formula (I) represents a difunctional silane monomer, that is to say the silane monomer includes two hydrolyzable groups; when a is 3, the silane monomer in formula (I) represents a monofunctional silane monomer, that is to say the silane monomer includes one hydrolyzable group. The aforementioned hydrolyzable groups refer to groups capable of performing hydrolysis and binding to silicon. The hydrolyzable groups may be alkoxyl groups, acyloxy groups, or phenoxy groups.

Examples of the aforementioned silane monomer include: (1) tetrafunctional silane monomer, such as tetramethoxysilane, tetraethoxysilane, tetraacetoxysilane, tetraphenoxy silane and the like; (2) trifunctional silane monomer, such as methyltrimethoxysilane (MTMS), methyltriethoxysilane, methyltriisopropoxysilane, methyltri-n-butoxysilane, ethyltrimethoxysilane, ethyltriethoxysilane, ethyltriisopropoxysilane, ethyltri-n-butoxysilane, n-propyltrimethoxysilane, n-propyltriethoxysilane, n-butyltrimethoxysilane, n-butyltriethoxysilane, n-hexyltrimethoxysilane, n-hexyltriethoxysilane, decyltrimethoxysilane, vinyltrimethoxysilane, vinyltriethoxysilane, 3-acryoyloxypropyltrimethoxysilane, 3-methylacryloyloxypropyltrimethoxysilane (MPTMS), 3-methylacryloyloxypropyltriethoxysilane, phenyltrimethoxysilane (PTMS), phenyltriethoxysilane (PTES), p-hydroxyphenyltrimethoxysilane, 1-(p-hydroxyphenyl)ethyltrimethoxysilane, 2-(p-hydroxyphenyl)ethyltrimethoxysilane, 4-hydroxy-5-(p-hydroxyphenylcarbonyloxy)pentyltrimethoxysilane, trifluoromethyltrimethoxysilane, trifluoromethyltriethoxysilane, 3,3,3-trifluoropropyltrimethoxysilane, 3-aminopropyltrimethoxysilane, 3-aminopropyltriethoxysilane, 3-glycidoxypropyltrimethoxysilane, 3-glycidoxypropyltriethoxysilane, 2-(3,4-epoxycyclohexyl)ethyltrimethoxysilane, 3-mercaptopropyltrimethoxysilane, 2-oxetanylbutoxypropyltriphenoxysilane, 2-oxetanylbutoxypropyltrimethoxysilane (made by Toagosei Co., Ltd., and the trade name is TMSOX-D), 2-oxetanylbutoxypropyltriethoxysilane (made by Toagosei Co., Ltd., and the trade name is TESOX-D), 3-triphenoxysilyl propyl succinic anhydride (made by Shin-Etsu Chemical Co., Ltd., and the trade name is X-12-967), 3-(triethoxysilyl)propyl succinic anhydride (made by Wacker Chemie AG Co. Ltd., and the trade name is GF-20), 3-(trimethoxysilyl)propyl glutaric anhydride (TMSG), 3-(triethoxysilyl)propyl glutaric anhydride, 3-(triphenoxysilyl)propyl glutaric anhydride and the like; (3) difunctional silane monomer, such as dimethyldimethoxysilane (DMDMS), dimethyldiethoxysilane, dimethyldiacetyloxysilane, di-n-butyldimethoxysilane, diphenyldimethoxysilane, diisopropoxy-di(2-oxetanylbutoxypropyl)silane (DIDOS), di(3-oxetanylpentyl)dimethoxy silane, (di-n-butoxysilyl) di(propyl succinic anhydride), (dimethoxysilyl) di(ethyl succinic anhydride) and the like; (4) monofunctional silane monomer, such as trimethylmethoxysilane, tri-n-butylethoxysilane, 3-glycidoxypropyldimethylmethoxysilane, 3-glycidoxypropyldimethylethoxysilane, di(2-oxetanylbutoxypentyl)-2-oxetanylpentylethoxysilane, tri(2-oxetanylpentyl)methoxy silane, phenoxysilyltripropyl succinic anhydride, methoxysilyldiethyl succinic anhydride and the like. The aforementioned silane monomer may be used alone or in combination of two or more.

Preferably, the polysiloxane (B) of the present invention includes a polysiloxane prepolymer having a structure of formula (V):

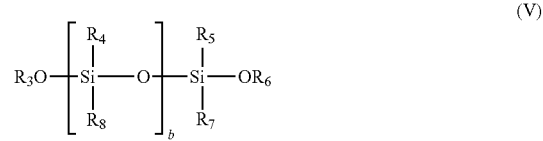

(V)

In formula (V), $R_4$, $R_5$, $R_7$, and $R_8$ independently represent a hydrogen atom, an alkyl group of 1 to 10 carbons, an alkenyl group of 2 to 6 carbons, or an aromatic group of 6 to 15 carbons. $R_3$ and $R_6$ independently represent a hydrogen atom, an alkyl group of 1 to 6 carbons, an acyl group of 1 to 6 carbons, or an aromatic group of 6 to 15 carbon atoms. b may represent an integer of 1 to 1000.

When $R_4$, $R_5$, $R_7$, and $R_8$ independently represent an alkyl group of 1 to 10 carbons, each of $R_4$, $R_5$, $R_7$, and $R_8$ may be a methyl group, an ethyl group, or a n-propyl group. When $R_4$, $R_5$, $R_7$, and $R_8$ respectively represent an alkenyl group of 2 to 6 carbons, each of $R_4$, $R_5$, $R_7$, and $R_8$ may be a vinyl group, an acryloyloxypropyl group, or a methylacryloyloxypropyl group. When $R_4$, $R_5$, $R_7$, and $R_8$ independently represent an aromatic group of 6 to 15 carbons, each of $R_4$, $R_5$, $R_7$, and $R_8$ may be a phenyl group, a tolyl group, or a naphthyl group. Any of the aforementioned alkyl group, alkenyl group, or aromatic group may optionally have substituents.

When $R_3$ and $R_6$ independently represent an alkyl group of 1 to 6 carbons, each of $R_3$ and $R_6$ may be a methyl group, an ethyl group, a n-propyl group, an isopropyl group, or a n-butyl group. When $R_3$ and $R_6$ independently represent an acyl group of 1 to 6 carbons, $R_3$ and $R_6$ may be a vinyl group. When $R_3$ and $R_6$ independently represent an aromatic group of 6 to 15 carbons, $R_3$ and $R_6$ may be a phenyl group. Any of the aforementioned alkyl group, acyl group, or aromatic group may optionally have substituents.

In formula (V), b is an integer of 1 to 1000, preferably is an integer of 3 to 300, and more preferably is an integer of 5 to 200. When b is an integer of 2 to 1000, a plurality of $R_4$ respectively is the same or different groups, and ditto for a plurality of $R_8$.

Examples of the polysiloxane prepolymer having a structure of formula (V) include: 1,1,3,3-tetramethyl-1,3-diethoxydisiloxane, 1,1,3,3-tetramethyl-1,3-dimethoxydisiloxane, 1,1,3,3-tetraethyl-1,3-diethoxydisiloxane, silanol terminated polydimethylsiloxane manufactured by Gelest, Inc., and the trade names are DMS-S12 (Molecular weight: 400 to 700), DMS-S15 (Molecular weight: 1500 to 2000), DMS-S21 (Molecular weight: 4200), DMS-S27 (Molecular weight: 18000), DMS-S31 (Molecular weight: 26000), DMS-S32 (Molecular weight: 36000), DMS-S33 (Molecular weight: 43500), DMS-S35 (Molecular weight: 49000), DMS-S38 (Molecular weight: 58000), DMS-S42 (Molecular weight: 77000), or PDS-9931 (Molecular weight: 1000 to 1400). The aforementioned polysiloxane prepolymer having a structure of formula (V) may be used alone or in combination of two or more.

The aforementioned silane monomer and polysiloxane prepolymer may be used in combination, and there is no particular limitation in the combining ratio between the both. Preferably, the molar ratio of silicon atoms in the silane monomer to the one in the polysiloxane prepolymer is 100: 0.01 to 50:50.

Furthermore, the polysiloxane (B) may be prepared by copolymerizing the aforementioned silane monomer and/or the polysiloxane prepolymer, or by copolymerizing with silicon dioxide particles.

There is no particular limitation in the average particle size of the silicon dioxide particles. The average particle size of the silicon dioxide particles may be 2 nm to 250 nm, preferably is 5 nm to 200 nm, and more preferably is 10 nm to 100 nm.

Examples of the aforementioned silicon dioxide particles include: products manufactured by JGC C&C Co. Ltd., and the trade names are OSCAL 1132 (particle size is 12 nm, and dispersant is methanol), OSCAL 1332 (particle size is 12 nm, and dispersant is n-propanol), OSCAL 105 (particle size is 60 nm, and dispersant is γ-butyrolactone), and OSCAL 106 (particle size is 120 nm, and dispersant is diacetone alcohol); products manufactured by Fuso Chemical Co. LTD., and the trade names are Quartron PL-1-IPA (particle size is 13 nm, and dispersant is isopropyl ketone), Quartron PL-1-TOL (particle size is 13 nm, and dispersant is toluene), Quartron PL-2L-PGME (particle size is 18 nm, and dispersant is propylene glycol monomethyl ether), and Quartron PL-2L-MEK (particle size is 18 nm, and dispersant is methyl ethyl ketone); and products manufactured by Nissan Chemical Industries Co. LTD., and the trade names are IPA-ST (particle size is 12 nm, and dispersant is isopropanol), EG-ST (particle size is 12 nm, and dispersant is ethylene glycol), IPA-ST-L (particle size is 45 nm, and dispersant is isopropanol), and IPA-ST-ZL (particle size is 100 nm, and dispersant is isopropanol). The aforementioned silicon dioxide particles may be used alone or in combination of two or more.

The aforementioned silicon dioxide particles may be used in combination of the silane monomer and/or the polysiloxane prepolymer, and there is no particular limitation in the combining ratio. Preferably, based on the molar ratio of silicon atoms in the silane monomer as 100%, the molar ratio of silicon atoms in the silicon dioxide particles is 1% to 50%.

The silane monomer, polysiloxane prepolymer, and/or silicon dioxide particles is subjected to a polymerization reaction, that is to say hydrolysis and partially condensation, by the following method. A solvent and water are added into a mixture of the silane monomer, the polysiloxane prepolymer, and/or the silicon dioxide particles, and a catalyst may be added optionally. Then, the mixture is stirred at 50° C. to 150° C. for 0.5 hours to 120 hours, and byproducts (e.g., alcohol and water) may be removed by further performing distillation.

There is no particular limitation in the solvent of the aforementioned polymerization reaction, and the solvent may be the same as or different from the solvent (D) in the positive photosensitive resin composition of the present invention. Based on the total amount of the silane monomer, the polysiloxane prepolymer, and/or the silicon dioxide particles as 100 g, the amount of the solvent is 15 g to 1200 g, preferably is 20 g to 1100 g, and more preferably is 30 g to 1000 g.

Based on the total amount of the hydrolyzable groups in the silane monomer, the polysiloxane prepolymer, and/or the silicon dioxide particles as 1 mole, the water used in the aforementioned polymerization reaction (that is to say the water used for hydrolysis) is 0.5 moles to 2 moles.

There is no particular limitation in the aforementioned catalyst, preferably is selected from acidic catalysts or basic catalysts. Examples of the acidic catalyst include: hydrochloric acid, nitric acid, sulfuric acid, hydrofluoric acid, oxalic acid, phosphoric acid, acetic acid, trifluoroacetic acid, formic acid, polybasic carboxylic acid, the acid anhydride or ion-exchange resin thereof and the like. Examples of the basic catalyst include: diethylamine, triethylamine, tripropylamine, tributylamine, tripentylamine, trihexylamine, triheptylamine, trioctylamine, diethanolamine, triethanolamine, sodium hydroxide, potassium hydroxide, alkoxysilane or ion-exchange resin having an amine group and the like.

Based on the total amount of the silane monomer, the polysiloxane prepolymer, and/or the silicon dioxide particle as 100 g, the amount of the catalyst is 0.005 g to 15 g, preferably is 0.01 g to 12 g, and more preferably is 0.05 g to 10 g.

In view of the stability, the polysiloxane (B) preferably does not contain byproducts (e.g., alcohol and water) and catalysts. Therefore, purification may be selectively performed to the reacting mixture after the polymerization reaction to obtain the polysiloxane (B). There is no particular limitation in the aforementioned purification. Preferably, the purification is performed by diluting the reacting mixture with a hydrophobic solvent. Then, the aforementioned hydrophobic solvent and the reacting mixture are transferred into a separation funnel. And then, an organic layer in the separation funnel is extracted by water for several times, and the aforementioned organic layer is concentrated by a rotary evaporator to remove alcohol or water. Moreover, the catalyst can be removed by an ion-exchange resin.

Based on the amount of the novolac resin (A) as 100 parts by weight, the amount of the polysiloxane (B) is 1 part by weight to 20 parts by weight, preferably is 2 parts by weight to 15 parts by weight, and more preferably is 3 parts by weight to 10 parts by weight.

If the positive photosensitive resin composition of the present invention does not include the polysiloxane (B), the obtained positive photosensitive resin composition will have defects of a poor stripping ability and a poor cross section shape of the pattern.

Ortho-naphthoquinone Diazide Sulfonic Acid Ester (C)

There is no particular limitation in the ortho-naphthoquinone diazide sulfonic acid ester (C), and a conventional ortho-naphthoquinone diazide sulfonic acid ester may be used. The ortho-naphthoquinone diazide sulfonic acid ester (C) may be an ester-based compound that is completely esterified or partially esterified.

The ortho-naphthoquinone diazide sulfonic acid ester (C) is preferably obtained by a reaction with o-naphthoquinone diazide sulfonic acid or the salt thereof and a hydroxy compound. The ortho-naphthoquinone diazide sulfonic acid ester (C) is more preferably obtained by the reaction with o-naphthoquinone diazide sulfonic acid or the salt thereof and a polyhydroxy compound.

Examples of the o-naphthoquinone diazide sulfonic acid include: o-naphthoquinonediazide-4-sulfonic acid, o-naphthoquinonediazide-5-sulfonic acid, o-naphthoquinonediazide-6-sulfonic acid and the like. Examples of the salt of the o-naphthoquinone diazide sulfonic acid include: diazonaphthoquinone sulfonyl halide.

Examples of the aforementioned hydroxy compound include: (1) hydroxybenzophenone-based compound; (2) hydroxyaryl-based compound; (3) (hydroxyphenyl)hydrocarbon compound; and (4) other aromatic hydroxy compounds.

The aforementioned hydroxybenzophenone-based compound may include but is not limited to 2,3,4-trihydroxy benzophenone, 2,4,4'-trihydroxy benzophenone, 2,4,6-trihydroxy benzophenone, 2,3,4,4'-tetrahydroxy benzophenone, 2,4,2',4'-tetrahydroxy benzophenone, 2,4,6,3',4'-pentahydroxy benzophenone, 2,3,4,2',4'-pentahydroxy benzophenone, 2,3,4,2',5'-pentahydroxy benzophenone, 2,4,5,3',5'-pentahydroxy benzophenone, 2,3,4,3',4',5'-hexahydroxy benzophenone and the like.

The aforementioned hydroxyaryl-based compound may include the hydroxyaryl-based compound having a structure of formula (VI):

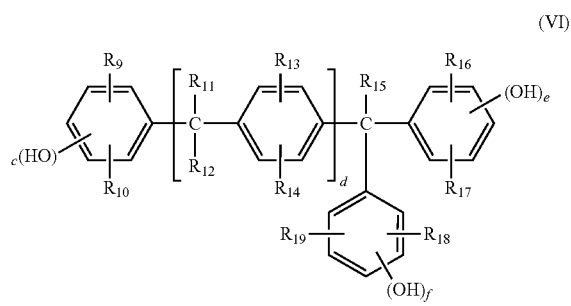

In formula (VI), $R_9$ and $R_{10}$ independently represent a hydrogen atom, a halogen atom, or an alkyl group of 1 to 6 carbons; $R_{11}$, $R_{12}$, and $R_{15}$ independently represent a hydrogen atom or an alkyl group of 1 to 6 carbons; $R_{13}$, $R_{14}$, $R_{16}$, $R_{17}$, $R_{18}$, and $R_{19}$ independently represent a hydrogen atom, a halogen atom, an alkyl group of 1 to 6 carbons, an alkoxy group of 1 to 6 carbons, an alkenyl group of 1 to 6 carbons or a cycloalkyl group of 1 to 6 carbons; c, e, f independently represent an integer of 1-3; and d represents 0 or 1.

Examples of the hydroxyaryl-based compound having a structure of formula (VI) include: tris(4-hydroxyphenyl) methane, bis(4-hydroxy-3,5-dimethylphenyl)-4-hydroxyphenyl methane, bis(4-hydroxy-3,5-dimethylphenyl)-3-hydroxyphenyl methane, bis(4-hydroxy-3,5-dimethylphenyl)-2-hydroxyphenyl methane, bis(4-hydroxy-2,5-dimethylphenyl)-4-hydroxyphenyl methane, bis(4-hydroxy-2,5-dimethylphenyl)-3-hydroxyphenyl methane, bis(4-hydroxy-2,5-dimethylphenyl)-2-hydroxyphenyl methane, bis(4-hydroxy-3,5-dimethylphenyl)-3,4-dihydroxyphenyl methane, bis(4-hydroxy-2,5-dimethylphenyl)-3,4-dihydroxyphenyl methane, bis(4-hydroxy-3,5-dimethylphenyl)-2,4-dihydroxyphenyl methane, bis(4-hydroxy-2,5-dimethylphenyl)-2,4-dihydroxyphenyl methane, bis(4-hydroxyphenyl)-3-methoxy-4-hydroxyphenyl methane, bis(3-cyclohexyl-4-hydroxyphenyl)-3-hydroxyphenyl methane, bis(3-cyclohexyl-4-hydroxyphenyl)-2-hydroxyphenyl methane, bis(3-cyclohexyl-4-hydroxyphenyl)-4-hydroxyphenyl methane, bis(3-cyclohexyl-4-hydroxy-6-methylphenyl)-2-hydroxyphenyl methane, bis(3-cyclohexyl-4-hydroxy-6-methylphenyl)-3-hydroxyphenyl methane, bis(3-cyclohexyl-4-hydroxy-6-methylphenyl)-4-hydroxyphenyl methane, bis(3-cyclohexyl-4-hydroxy-6-methylphenyl)-3,4-dihydroxyphenyl methane, bis(3-cyclohexyl-6-hydroxyphenyl)-3-hydroxyphenyl methane, bis(3-cyclohexyl-6-hydroxyphenyl)-4-hydroxyphenyl methane, bis(3-cyclohexyl-6-hydroxyphenyl)-2-hydroxyphenyl methane, bis(3-cyclohexyl-6-hydroxy-4-methylphenyl)-2-hydroxyphenyl methane, bis(3-cyclohexyl-6-hydroxy-4-methylphenyl)-4-hydroxyphenyl methane, bis(3-cyclohexyl-6-hydroxy-4-methylphenyl)-3,4-dihydroxyphenyl methane, 1-[1-(4-hydroxyphenyl)isopropyl]-4-[1,1-bis(4-hydroxyphenyl)ethyl]benzene, 1-[1-(3-methyl-4-hydroxyphenyl)isopropyl]-4-[1,1-bis(3-methyl-4-hydroxyphenyl)ethyl]benzene and the like.

The aforementioned (hydroxyphenyl) alkyl compound has a structure of formula (VII):

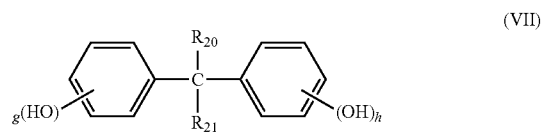

In formula (VII), $R_{20}$ and $R_{21}$ independently represent a hydrogen atom or an alkyl group of 1 to 6 carbons; and g and h independently represent an integer of 1 to 3.

Examples of the (hydroxyphenyl) alkyl compound having a structure of formula (VII) include: 2-(2,3,4-trihydroxyphenyl)-2-(2,3',4'-trihydroxyphenyl)propane, 2-(2,4-dihydroxyphenyl)-2-(2',4'-dihydroxyphenyl)propane, 2-(4-hydroxyphenyl)-2-(4'-hydroxyphenyl)propane, bis(2,3,4-trihydroxyphenyl)methane, bis(2,4-dihydroxyphenyl) methane or the like.

Examples of the aforementioned other aromatic hydroxy compounds include: phenol, p-methoxyphenol, dimethylphenol, hydroquinone, bisphenol A, naphthol, catechol, pyrogallol ether, pyrogallol 1,3-dimethyl ether, 3,4,5-trihydroxybenzoic acid, partially esterified 3,4,5-trihydroxybenzoic acid, partially etherified 3,4,5-trihydroxybenzoic acid or the like.

The aforementioned hydroxy compound may be used alone or in combination of two or more. Preferably, the hydroxy compound may be 1-[1-(4-hydroxyphenyl)isopropyl]-4-[1,1-bis(4-hydroxyphenyl)ethyl]benzene, 2,3,4-trihydroxy benzophenone, or 2,4,4'-trihydroxy benzophenone.

The reaction performed to the o-naphthoquinone diazide sulfonic acid or the salt thereof and the hydroxy compound is usually performed in organic solvent, e.g., dioxane, N-pyrrolidone, and acetamide. Preferably, the reaction is performed in alkaline condensing agent, e.g., triethanolamine, alkali metal carbonate, and alkali metal bicarbonate.

The degree of esterification of the ortho-naphthoquinone diazide sulfonic acid ester (C) is preferably 50% or more, i.e., based on the total amount of the hydroxyl groups in the hydroxy compound as 100 mol %, the esterification reaction is performed by 50 mol % or more hydroxyl groups in the hydroxy compound and o-naphthoquinone diazide sulfonic acid or the salt thereof. More preferably, the degree of esterification of the ortho-naphthoquinone diazide sulfonic acid ester (C) is 60% or more.

Based on the novolac resin (A) as 100 parts by weight, the amount of the ortho-naphthoquinone diazide sulfonic acid ester (C) is 5 parts by weight to 60 parts by weight, preferably is 8 parts by weight to 50 parts by weight, and more preferably is 10 parts by weight to 40 parts by weight.

Solvent (D)

The solvent (D) used in the positive photosensitive resin composition of the present invention refers to an organic solvent, which is miscible with other organic components, but not interacts with the aforementioned components.

Examples of the solvent (D) of the present invention include: (poly)alkylene glycol monoalkyl ether; such as ethylene glycol monomethyl ether, ethylene glycol monoethyl ether, diethylene glycol monoethyl ether, diethylene glycol mono-n-propyl ether, diethylene glycol mono-n-butyl ether, triethylene glycol monomethyl ether, triethylene glycol monoethyl ether, propylene glycol monomethyl ether, propylene glycol monoethyl ether, dipropylene glycol monomethyl ether, dipropylene glycol monoethyl ether, dipropylene glycol mono-n-propyl ether, dipropylene glycol mono-n-butyl ether, tripropylene glycol monomethyl ether, tripropylene glycol monoethyl ether and the like; (poly)alkylene glycol monoalkyl ether acetate; such as ethylene glycol monomethyl ether acetate, ethylene glycol monoethyl ether acetate, propylene glycol monomethyl ether acetate, propylene glycol monoethyl ether acetate and the like; other ethers, such as diethylene glycol dimethyl ether, diethylene glycol methyl ethyl ether, diethylene glycol diethyl ether, tetrahydrofuran and the like; ketone, such as methyl ethyl ketone, cyclohexanone, 2-heptanone, 3-heptanone, 4-hydroxy-4-methyl-2-pentanone and the like; lactic acid alkyl ester, such as 2-hydroxypropanoic acid methyl ester 2-hydroxypropanoic acid ethyl ester (also known as ethyl lactate) and the like; other ethers, such as 2-hydroxy-2-methylpropanoic acid methyl ester, 2-hydroxy-2-methylpropanoic acid ethyl ester, 3-hydroxypropanoic acid methyl ester, 3-methoxypropanoic acid methyl ester, 3-methoxypropanoic acid ethyl ester, 3-ethoxypropanoic acid methyl ester, 3-ethoxypropanoic acid ethyl ester, ethoxyacetic acid ethyl ester, hydroxyacetic acid ethyl ester, 2-hydroxy-3-methylbutyric acid methyl ester, 3-methyl-3-methoxybutyl acetic acid ester, 3-methyl-3-methoxybutyl propanoic acid ester, ethyl acetate, n-propyl acetate, isopropyl acetate, n-butyl acetate, isobutyl acetate, n-pentyl acetate, isopentyl acetate, n-butyl propionate, ethyl butanoate, n-propyl butanoate, isopropyl butanoate, n-butyl butanoate, methyl pyruvate, ethyl pyruvate, n-propyl pyruvate, methyl acetoacetate, ethyl acetoacetate, 2-oxopropanoic acid ethyl ester and the like; aromatic hydrocarbon, such as toluene, xylene and the like; and carboxylic acid amide, such as N-methylpyrrolidinone, N,N-dimethylformamide, N,N-dimethylacetamide and the like. The solvent (D) may be used alone or in combination of two or more. Preferably, the solvent (D) may be propylene glycol monoethyl ether, propylene glycol monomethyl ether acetate, or ethyl lactate.

Based on the amount of the novolac resin (A) as 100 parts by weight, the amount of the solvent (D) is usually 100 parts by weight to 1000 parts by weight, preferably is 100 parts by weight to 900 parts by weight, and more preferably is 150 parts by weight to 800 parts by weight.

Additive (E)

The positive photosensitive resin composition may selectively include an additive (E). The additive (E) may include but is not limited to adhesion aid, surface-leveling agent, dilutent, sensitizer and the like.

The aforementioned adhesion aid may include but is not limited to melamine compound and silane compound to improve the adhesive property between the positive photosensitive resin composition and the substrate. Examples of the aforementioned melamine compound include: commercial products manufactured by Cytec Industries Co. LTD., and the trade names are Cymel-300 or Cymel-303; and commercial products manufactured by Sanwa Chemical Co. LTD., and the trade names are MW-30 MH, MW-30, MS-11, MS-001, MX-750, and MX-706. Examples of the aforementioned silane compound include: vinyl trimethoxy silane, vinyl triethoxy silane, 3-methacryloxypropyl trimethoxysilane, 3-acryloxypropyl trimethoxysilane, vinyl-tris(2-methoxyethoxy)silane, N-(2-aminoethyl)-3-aminopropylmethyldimethoxysilane, N-(2-aminoethyl)-3-aminopropyltrimethoxysilane, 3-aminopropyltriethoxysilane, 3-glycidoxypropyltrimethoxysilane, 3-glycidoxypropyldimethylmethoxysilane, 2-(3,4-epoxycyclohexyl)ethyltrimethoxysilane, 3-chloropropylmethyldimethoxysilane, 3-chloropropyltrimethoxysilane, 3-mercaptopropyltrimethoxysilane, and 1,2-bis(trimethoxysilyl)ethane.

In an example of the present invention, based on the novolac resin (A) as 100 parts by weight, the amount of the aforementioned melamine compound as the adhesion aid is 0 part by weight to 20 parts by weight, preferably is 0.5 parts by weight to 18 parts by weight, and more preferably is 1.0 part by weight to 15 parts by weight; and the amount of the aforementioned silane compound as the adhesion aid is 0 part by weight to 2 parts by weight, preferably is 0.001 part by weight to 1 part by weight, and more preferably is 0.005 parts by weight to 0.8 parts by weight.

The aforementioned surface-leveling agent may include but is not limited to fluorine-based surfactant or silicone-based surfactant. Examples of the fluorine-based surfactant include: commercial products manufactured by 3M Co. LTD., and the trade name are Fluorad FC-430 or FC-431; and products manufactured by Tochem Products Co. Ltd., and the trade name are F top EF122A, 122B, 122C, 126, or BL20. Examples of the silicone-based surfactant include: products manufactured by Dow Corning Toray Silicone Co. LTD., and the trade names are SF8427 or SH29PA.

In an example of the present invention, based on the novolac resin (A) as 100 parts by weight, the amount of the aforementioned surfactant is generally 0 part by weight to 1.2 parts by weight, preferably is 0.025 parts by weight to 1.0 part by weight, and more preferably is 0.050 parts by weight to 0.8 part by weight.

Examples of the aforementioned dilutent include: products manufactured by Teikoku Printing Inks Mfg. Co. Ltd., and the trade names are RE801 or RE802.

Examples of the aforementioned sensitizer include: products manufactured by Honshu Chemical Industry Co. Ltd., and the trade names are TPPA-1000P, TPPA-100-2C, TPPA-1100-3C, TPPA-1100-4C, TPPA-1200-24x, TPPA-1200-26x, TPPA-1300-235T, TPPA-1600-3M6C, or TPPA-MF, and preferably is TPPA-1600-3M6C or TPPA-MF. The sensitizer may be used alone or in combination of two or more.

The aforementioned additive (E) may be used alone or in combination of two or more.

In an example of the present invention, based on the novolac resin (A) as 100 parts by weight, the amount of the aforementioned sensitizer is generally 0 part by weight to 20 parts by weight, preferably is 0.5 parts by weight to 18 parts by weight, and more preferably is 1.0 part by weight to 15 parts by weight. Moreover, the present invention may optionally include other additives as practical need, e.g., plasticizer stabilizer and the like.

Method for Preparing Positive Photosensitive Resin Composition

The positive photosensitive resin composition is generally prepared by uniformly stirring the aforementioned novolac resin (A), polysiloxane (B), ortho-naphthoquinone diazide sulfonic acid ester (C), and solvent (D) in a conventional stirrer to obtain a solution, and various additives (E) may be added if necessary, so as to obtain the positive photosensitive resin composition.

Method for Forming Pattern

The aforementioned positive photosensitive resin composition is subjected to a coating process, a pre-bake process, an exposure process, a development process, and a post-bake process, so as to form a pattern on a substrate.

Furthermore, the aforementioned positive photosensitive resin composition is coated on the substrate by a coating process in the method for forming pattern, such as spin coating, cast coating, roll coating or the like. After the coating process is performed, the solvent is removed by a pre-baking process, so as to form a pre-baked coating film. According to the differences of kinds of the compositions and a ratio among the compositions, the pre-bake process is generally performed at 70° C. to 110° C. for 1 minute to 15 minutes.

After the pre-bake process is performed, the pre-baked coating film is subjected to an exposure process under a specified photomask. Then, the pre-baked coating film is immersed in a developing solution at 21° C. to 25° C. for 15 seconds to 5 minutes to remove unwanted portions, so as to form a specific pattern.

The light used in the exposure process is preferably ultraviolet light, such as g-ray, h-ray, and i-ray. The ultraviolet light irradiation apparatus may be a (ultra) high-pressure mercury lamp and a metal halide lamp.

Examples of the developing solution used in the present invention are basic compounds, such as sodium hydroxide, potassium hydroxide, sodium carbonate, sodium bicarbonate, potassium carbonate, potassium bicarbonate, sodium silicate, sodium methyl silicate, ammonia, ethylamine, diethylamine, dimethylethanolamine, tetramethylammonium hydroxide, choline, pyrrole, piperidine, 1,8-diazabicyclo[5.4.0]undec-7-ene or the like.

Preferably, the concentration of the developing solution may be 0.001 wt % to 10 wt %, more preferably is 0.005 wt % to 5 wt %, and particularly preferably is 0.01 wt % to 1 wt %.

When the abovementioned basic compounds are used to form the developing solution, the coating film is washed with water after the developing process, and then the pattern is air-dried by using compressed air or nitrogen gas. Then, the post-bake process is performed to the coating film by a heating device, such as hot plate and oven. The postbake is generally carried out at 150° C. to 250° C. for 5 minutes to 60 minutes on the hot plate, or for 15 minutes to 150 minutes in the oven. After the above steps, the black matrix can be formed on the substrate.

Thin-Film Transistor Array Substrate

The thin-film transistor array substrate of the present invention is formed by the abovementioned method. In brief, the positive photosensitive resin composition of the present invention can be coated on a glass substrate or a plastic substrate including a film by the coating process, so as to form a positive photoresist layer. The aforementioned film can be an aluminum film, a chromium film, a silicon nitride film, an amorphous silicon film or the like, and the coating process can be a spin coating, a cast coating, a roll coating and the like. Next, the pre-bake process, the exposure process, the development process, and the post-bake process are performed in sequence to form a photosensitive resin pattern. Then, an etching process and a photoresist stripping process are performed. A thin-film transistor array substrate having a plurality of thin-film transistors or electrodes may be obtained by repeating the aforementioned steps.

Referring to FIG. 1, which illustrates a partial cross-sectional view of a thin-film transistor array substrate for liquid crystal display (LCD) element according to one embodiment of the present invention. First, a gate 102a and a storage capacitor Cs electrode 102b are disposed on the aluminum film of a glass substrate 101. Next, a silicon oxide ($SiO_x$) 103 and silicon nitride ($SiN_x$) 104 are covered on the gate 102a, so as to form an insulating film, and an amorphous silicon layer (a-Si) 105 is formed on the insulating layer as a semiconductor active layer. Then, in order to reduce junction resistance, an amorphous silicon layer 106 doping with nitrogen impurity may be formed on the amorphous silicon layer 105. Then, a drain 107a and a source 107b are formed by metal such as aluminum and the like. The drain 107a is connected to a data signal line (not shown), and the source 107b is connected to a pixel electrode (or sub-pixel electrode) 109. And then, in order to protect the amorphous silicon layer 105 as the semiconductor active layer, the drain 107a, the source 107b, etc., a nitride silicon film is formed as a protecting film 108.

Liquid Crystal Display (LCD) Element

The LCD element of the present invention at least includes the aforementioned thin-film transistor array substrate, and may include other components if necessary.

Examples of the basic construction of the aforementioned LCD element include: (1) A spacer is inserted between the aforementioned thin-film transistor substrate array (driving substrate) and a color filter substrate, which are configured in opposite directions. The thin-film transistor substrate array is formed by the arrangement of the driving element and pixel electrode (conductive layer) of the thin-film transistor, etc., and the color filter substrate is formed by a color filter and a counter electrode (conductive layer). Then, a liquid crystal material is injected into a gap between the thin-film transistor substrate array and the color filter substrate, so as to obtain the LCD element. (2) A spacer is inserted between a color filter integrated thin-film transistor array substrate and an opposing substrate, which are configured in opposite directions. The color filter integrated thin-film transistor array substrate is formed by disposed a color filter directly on the aforementioned thin-film transistor substrate array, and the opposing substrate is configured with an opposing electrode (conductive layer). Then, a liquid crystal material is injected into a gap between the color filter integrated thin-film transistor array substrate and the opposing substrate, so as to obtain the LCD element. The aforementioned liquid crystal material may be any liquid crystal compounds or liquid crystal compositions, and there is no specific limitation in the present invention.

Examples of the aforementioned conductive layer can include but not limited to indium tin oxide film; metal film, such as aluminum, zinc, copper, iron, nickel, chromium, molybdenum and the like; metal oxide film, such as silicon dioxide and the like. Preferably, the conductive layer is a transparent film. More preferably, the conductive layer is an indium tin oxide film.

Examples of the substrate used in the thin-film transistor array substrate, the color filter substrate, and the opposing substrate of the present invention can include but not limited to a conventional glass substrate, such as soda-lime glass, low-expansion glass, alkali-free glass, quartz glass or the like. Further, the aforementioned substrate may also be a substrate composed of plastic film.

Several embodiments are described below to illustrate the application of the present invention. However, these embodiments are not used for limiting the present invention. For those skilled in the art of the present invention, various variations and modifications can be made without departing from the spirit and scope of the present invention.

BRIEF DESCRIPTION OF THE DRAWINGS

The invention can be more fully understood by reading the following detailed description of the embodiment, with reference made to the accompanying drawings as follows.

DETAILED DESCRIPTION

Preparing Novolac Resin (A)

Figure 1:
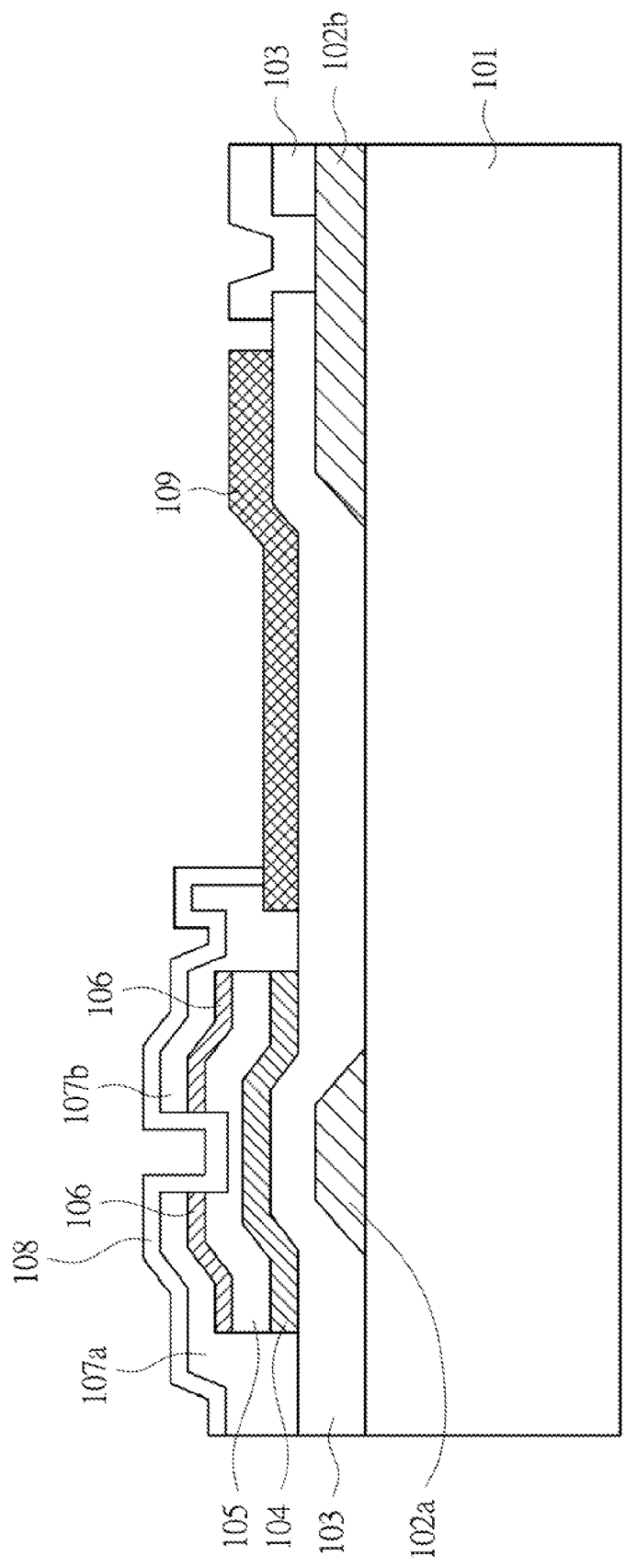
FIG. 1 illustrates a partial cross-sectional view of a thin-film transistor array substrate for liquid crystal display element according to one embodiment of the present invention.

The following novolac resin (A) of preparation examples A-1-1 to A-2-3 is prepared according to Table 1.

Preparation Example A-1-1

A nitrogen inlet, a stirrer, a heater, a condenser, and a thermometer were set on a 1000 ml four-neck flask, and 0.4 moles of m-cresol, 0.5 moles of p-cresol, 0.1 moles of 3,4-xylenol, 0.65 moles of formaldehyde, and 0.02 moles of oxalic acid were added after nitrogen was introduced. The reaction solution was stirred slowly and heated to 100° C., and polycondensation is performed at the temperature for 6 hours. Then, the reaction solution was heated to 180° C., and dried under reduced pressure of 10 mmHg. The xylenol-type novolac resin (A-1-1) was obtained after solvent is evaporated.

Preparation Examples A-1-2 to A-1-4

The preparation method in Preparation Examples A-1-2 to A-1-4 uses the same method as in Preparation Example A-1-1 to prepare the xylenol-type novolac resin, the difference is that in Preparation Examples A-1-2 to A-1-4, the type and amount of the raw material used for the novolac resin and polymerization conditions were changed, the formulation and polymerization conditions are shown in Table 1, thus not repeated here again.

Preparation Example A-2-1

A nitrogen inlet, a stirrer, a heater, a condenser, and a thermometer were set on a 1000 ml four-neck flask, and 0.7 moles of m-cresol, 0.3 moles of p-cresol, 0.7 moles of formaldehyde, and 0.015 moles of oxalic acid were added after nitrogen was introduced. The reaction solution was stirred slowly and heated to 100° C., and polycondensation is performed at the temperature for 6 hours. Then, the reaction solution was heated to 180° C., and dried under reduced pressure of 10 mmHg. The hydroxy-type novolac resin (A-2-1) was obtained after solvent is evaporated.

Preparation Examples A-2-2 and A-2-3

The preparation method in Preparation Examples A-2-2 to A-2-3 uses the same method as in Preparation Example A-2-1 to prepare the hydroxy-type novolac resin, the difference is that in Preparation Examples A-2-2 to A-2-3, the type and amount of the raw material used for the novolac resin and polymerization conditions were changed, the formulation and polymerization conditions are shown in Table 1, thus not repeated here again.

Preparing Polysiloxane (B)

The following polysiloxane (B) of preparation examples B-1 to B-4 is prepared according to Table 2

Preparation Example B-1

0.3 moles of methyltrimethoxysilane (MTMS), 0.65 moles of phenyltrimethoxysilane (PTMS), 0.05 moles of 3-(tri-ethoxysilyl)propyl succinic anhydride (GF-20), and 200 g of propylene glycol monoethyl ether (PGEE) were added to a 500 ml three-neck flask and stirred at room temperature, so as to form a reacting solution. An oxalic acid solution (0.4 g oxalic acid/75 g water) was added within 30 minutes. Next, the flask was immersed in an oil bath at 30° C. and stirred for 30 minutes. Then, the oil bath was heated to 120° C. within 30 minutes. When the temperature of the reacting solution was lowered to 105° C., the solution was continually heated and stirred, and polycondensation is performed for 6 hours. Then, the solvent was removed by distillation, so as to obtain the polysiloxane (B-1).

Preparation Examples 5-2 to B-4

The preparation method in Preparation Examples B-2 to B-4 uses the same method as in Preparation Example B-1 to prepare the polysiloxane, the difference is that in Preparation Examples B-2 to B-4, the type and amount of the raw material used for the polysiloxane and polymerization conditions were changed, the formulation and polymerization conditions are shown in Table 2, thus not repeated here again.

Preparing Positive Photosensitive Resin Composition

The following positive photosensitive resin compositions of Examples 1 to 8 and Comparative Examples 1 to 4 is prepared according to Table 3.

Example 1

100 parts by weight of the above novolac resin of Preparation Example A-2-1, 1 part by weight of the above polysiloxane of Preparation Example B-2, and 10 parts by weight of 2,3,4-trihydroxy benzophenone and (1,2-naphthoquinone 2-diazide)-5-sulfonic acid ester (hereinafter referred to as C-1) were added to 100 parts by weight of propylene glycol monomethyl ether acetate (PGMEA; hereinafter referred to as D-1). The above mixture was stirred to dissolve in the solvent by a swing-type stirrer, and the positive photosensitive resin composition of the present invention was obtained. The positive photosensitive resin composition was evaluated by the following evaluation methods, and the results are shown in Table 3, wherein the evaluation methods for stripping ability and cross section shape of pattern will be described hereinafter.

Examples 2 to 8 and Comparative Examples 1 to 4

The preparation method in Examples 2 to 8 and Comparative Examples 1 to 4 uses the same method as in Example 1 to prepare the positive photosensitive resin composition, the difference is that in Examples 2 to 8 and Comparative Examples 1 to 4, the type and amount of the raw material used for the positive photosensitive resin composition were changed, the formulation and evaluation results are shown in Table 3, thus not repeated here again.

Evaluation Methods

1. Stripping Ability

The positive photosensitive resin compositions of Examples 1 to 8 and Comparative Examples 1 to 4 were coated on blank glass substrates by spin coating, and the size of the blank glass substrate was 100 mm×100 mm×0.7 mm. After the positive photosensitive resin composition was coated, the substrates were pre-baked at 100° C. for 2 minutes to obtain pre-baked coating films with a thickness of about 3 μm. The aforementioned pre-baked coating films were respectively placed under a mask of line and space (manufactured by Nippon Filcon Co., Ltd.), and the pre-baled films were exposed by a ultraviolet light with a energy intensity of 150 mJ/cm$^2$ (Exposure machine was manufactured by M&R Nano Technology Co. Ltd., and the trade name is AG500-4N). Next, the coating films after exposure were placed into a TMAH solution with a concentration of 2.38%, and a developing process was performed to the coating films at 23° C. for 1 minute to remove the exposed portion of the coating films on the substrates. Then, the coating films were washed by pure water, and were post-baked at 230° C. for 30 minutes to obtain glass substrates having patterned coating films.

The aforementioned glass substrates were soaked in stripping solution (Manufactured by Chi Mei Co. LTD., and the trade name is ST897). The time that the patterns on the glass substrates were stripped were measured, and an evaluation was made according to the following criterion.

◎: stripping time<3 minutes.
○ 3 minutes≤stripping time<8 minutes.
X: 8 minutes≤stripping time.

2. Cross Section Shape of Pattern

Figure 2:
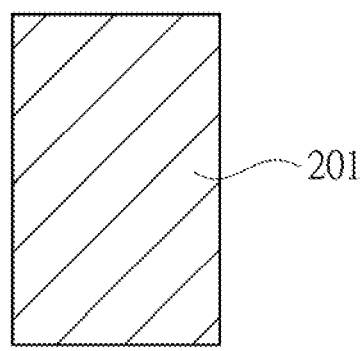
FIG. 2 illustrates cross section shapes of glass substrates having patterns formed by using embodiments 1-8 and comparative examples 1-4 of the present invention.
Figure 2:
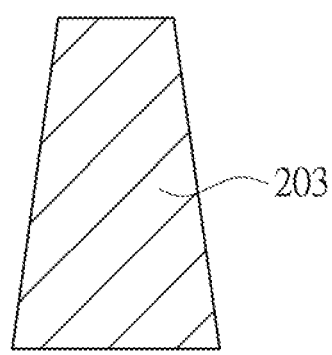

The positive photosensitive resin compositions of Examples 1 to 8 and Comparative Examples 1 to 4 were coated on blank glass substrates by spin coating, and the size of the blank glass substrate was 100 mm×100 mm×0.7 mm. After the positive photosensitive resin composition was coated, the substrates were pre-baked at 100° C. for 2 minutes to obtain pre-baked coating films with a thickness of about 3 μm. The aforementioned pre-baked coating films were respectively placed under a mask of line and space (manufactured by Nippon Filcon Co., Ltd.), and the pre-baled films were exposed by a ultraviolet light with a energy intensity of 150 mJ/cm$^2$ (Exposure machine was manufactured by M&R Nano Technology Co. Ltd., and the trade name is AG500-4N). Next, the coating films after exposure were placed into a TMAH solution with a concentration of 2.38%, and a developing process was performed to the coating films at 23° C. for 1 minute to remove the exposed portion of the coating films on the substrates. Then, the coating films were washed by pure water, and were post-baked at different temperature for 2 minutes to obtain glass substrates having patterned coating films. And then, the cross section shapes of patterns on the glass substrates were shot and observed by a scanning electron microscope. The cross section shape preferably is a vertical-shaped cross section 201 and a taper-shaped cross section 203 shown in FIG. 2. An evaluation of the cross section shape of patterns was made according to the following criterion and cross section shapes shown in FIG. 2.

◎: 130° C.<post-baking temperature.
○: 120° C.<post-baking temperature≤113° C.
X: post-baking temperature≤120° C. or the cross section shape cannot be the vertical-shaped cross section 201 or the taper-shaped cross section 203.

The evaluation results of stripping ability and cross section shape of pattern of the positive photosensitive resin compositions prepared by the aforementioned Examples and Comparative Examples are shown in Table 3.

inform the results of Table 3, when the positive photosensitive resin compositions include the novolac resin (A) and the polysiloxane (B), the obtained positive photosensitive resin compositions have a better stripping ability and a better cross section shape of pattern.

Next, when the novolac resin (A) in the positive photosensitive resin compositions includes the xylenol-type novolac resin (A-1), the positive photosensitive resin compositions having a better cross section shape of pattern can be obtained. Moreover, in the compound having a structure of formula (I), when at least one of the R$_1$ includes an alkyl group having an anhydride group, an alkyl group having an epoxy group, or an alkoxy group having an epoxy group, the obtained positive photosensitive resin compositions have a better stripping ability.

It is noteworthy that although the present invention has use specific compounds, compositions, reaction conditions, manufacturing processes, analytical methods, and apparatus as examples to describe the positive photosensitive resin composition and method for forming pattern by using the same of the present invention, it will be apparent to those skilled in the art that the present invention should not be limited to the description of the embodiments contained herein. The positive photosensitive resin composition and method for forming pattern by using the same of the present invention may use other compounds, compositions, reaction conditions, manufacturing processes, analytical methods, and apparatus without departing from the scope or spirit of the invention.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

TABLE 1

| Preparation example | Composition (mol) | | | | | | | | Catalyst oxalic acid | Reaction temperature (° C.) | Polycondensation time (hour) |
|---|---|---|---|---|---|---|---|---|---|---|---|
| | Aromatic hydroxy compound | | | | | | Aldehyde | | | | |
| | o-cresol | m-cresol | p-cresol | 3,5-xylenol | 3,4-xylenol | 2,5-xylenol | formaldehyde | benzaldehyde | | | |
| A-1-1 | | 0.40 | 0.50 | | 0.10 | | 0.65 | | 0.020 | 100 | 6 |
| A-1-2 | 0.10 | 0.30 | 0.55 | 0.05 | | | 0.70 | | 0.020 | 100 | 6 |
| A-1-3 | | 0.40 | 0.40 | | | 0.20 | 0.40 | 0.20 | 0.015 | 100 | 6 |
| A-1-4 | | 0.45 | 0.40 | | 0.05 | 0.10 | | 0.65 | 0.020 | 100 | 6 |
| A-2-1 | | 0.70 | 0.30 | | | | 0.70 | | 0.015 | 100 | 6 |
| A-2-2 | | 0.50 | 0.50 | | | | | 0.60 | 0.020 | 100 | 6 |
| A-2-3 | 0.05 | 0.65 | 0.30 | | | | 0.65 | | 0.020 | 95 | 6 |

TABLE 2

| Preparation Example | Silane Monomer or Polysiloxane Prepolyner (mole) | | | | | | | | Solvent (g) | | Catalyst (g) | | Reaction Temperature (° C.) | Polycondensation Time (hour) |
|---|---|---|---|---|---|---|---|---|---|---|---|---|---|---|
| | MTMS | DMDMS | PTMS | PTES | GF-20 | TMSG | TMSOX-D | DMS-S27 | PGEE | DAA | Water | Oxalic acid | | |
| B-1 | 0.30 | | 0.65 | | 0.05 | | | | 200 | | 75 | 0.40 | 105 | 6 |
| B-2 | | 0.40 | 0.40 | 0.20 | | | | | 100 | 100 | 75 | 0.40 | 110 | 5 |
| B-3 | | 0.60 | 0.35 | | | 0.05 | | | 200 | | 75 | 0.35 | 105 | 6 |
| B-4 | 0.65 | | | 0.25 | | | 0.09 | 0.01 | 200 | | 75 | 0.45 | 110 | 6 |

Compound
MTMS    Methyltrimethoxysilane
DMDMS   Dimethyldimethoxysilane
PTMS    Phenyltrimethoxysilane
PTES    Pnenyltriethoxysilane
GF-20   3-(trietboxysilyl)propyl succinic anhydride
TMSG    3-(trimethoxysilyl)propyl glutaric anhydride
TMSOX-D 2-oxetanylbutoxypropyltrimethoxysilane
DMS-S27 Silanol-terminated polysiloxane manufactured by Gelest Inc.
PGEE    Propylene glycol monoethyl ether
DAA     Diacetone alcohol

TABLE 3

| Composition | | Example | | | | | | | | Comparative Example | | | |
|---|---|---|---|---|---|---|---|---|---|---|---|---|---|
| | | 1 | 2 | 3 | 4 | 5 | 6 | 7 | 8 | 1 | 2 | 3 | 4 |
| Novolac Resin (A) (Parts by Weight) | A-1-1 | | | | 2 | | | | 5 | 100 | | | |
| | A-1-2 | | | | 20 | | | 50 | 5 | | 80 | | |
| | A-1-3 | | | | | 30 | | | | | | | |
| | A-1-4 | | | | | | 40 | | | | | | |
| | A-2-1 | 100 | | 98 | 40 | | | 50 | | | | | |
| | A-2-2 | | 100 | | 40 | | 60 | | | | | | |
| | A-2-3 | | | | | 70 | | | 90 | | 20 | | |
| Polysiloxane (B) (Parts by Weight) | B-1 | | | 3 | | | 15 | | | | | | |
| | B-2 | 1 | | 5 | | | 5 | | | | 100 | | |
| | B-3 | | | | 10 | | | 10 | | | | | 100 |
| | B-4 | | | | | 15 | | | 5 | | | | |
| Ortho-naphthoquinone Diazide Sulfonic Acid Ester (C) (Parts by Weight) | C-1 | 10 | | 20 | 30 | | 60 | 15 | 20 | 15 | | | 20 |
| | C-2 | | 5 | | | 20 | | 5 | | | 15 | 20 | |
| | C-3 | | | | 10 | | | | | | | | |
| Solvent (D) (Parts by Weight) | D-1 | 100 | 300 | 300 | | 500 | 800 | 500 | | 300 | 300 | 200 | |
| | D-2 | | | 200 | 500 | | 200 | | 300 | | | | 300 |
| | D-3 | | | | | 300 | | | | | | | |
| Additive (E) (Parts by Weight) | E-1 | | | | | | | 1 | | | | | |
| | E-2 | | | 0.5 | | | | | | | | | |
| Evaluation Method | Stripping Ability | ○ | ◎ | ○ | ◎ | ◎ | ◎ | ◎ | ◎ | X | X | X | X |
| | Cross Section Shape of Patterns | ○ | ○ | ◎ | ◎ | ◎ | ◎ | ◎ | ◎ | X | X | X | X |

C-1  2,3,4-Trihydroxy benzophenone and (1,2-naphthoquinone 2-diazide)-5-sulfonic acid ester
C-2  2,3,4,4'-Tetrahydroxy benzophenone and (1,2-naphthoquinone 2-diazide)-5-sulfonic acid ester
C-3  1-[1-(4-hydroxyphenyl)propyl]-4-[1,1-bis(4-hydroxyphenyl)ethyl]benzene and (1,2-naphthoquinone 2-diazide)-5-sulfonic acid ester
D-1  Propylene glycol monomethyl ether acetate (PGMEA)
D-2  Ethyl lactate (EL)
D-3  Propylene glycol monoethyl ether(PGEE)
E-1  Surfactant: Trade name is SF8427, and manufactured by Toray Dow Corning Silicone Co. LTD.
E-2  Adhesion additive: Trade name is Cymel-303, and manufactured by CYTEC Co. LTD.

What is claimed is:

1. A positive photosensitive resin composition, comprising:
   a novolac resin (A);
   a polysiloxane (B), formed by polymerizing a compound having a structure of formula (I);
   $Si(R_1)_a (OR_2)_{4-a}$ (I), wherein $R_1$ represents a hydrogen atom, an alkyl group of 1 to 10 carbons, an alkenyl group of 2-10 carbons, an aromatic group of 6 to 15 carbons, an alkyl group having an anhydride group, an alkyl group having an epoxy group, or an alkoxy group having an epoxy group and at least one of the $R_1$ comprimises an alkyl group having an anhydride group, an alkyl group having an epoxy group, or an alkoxy group having an epoxy group; $R_2$ represents a hydrogen atom, an alkyl group of 1 to 6 carbons, an acyl group of 1 to 6 carbons, or an aromatic group of 6 to 15 carbons; wherein a represents an integer of 1 to 3;

an ortho-naphthoquinone diazide sulfonic acid ester (C); and a solvent (D), wherein an amount of the polysiloxane (B) is 1 part by weight to 20 parts by weight based on 100 parts by weight of the novolac resin (A).

2. The positive photosensitive resin composition of claim 1, wherein the novolac resin (A) includes a novolac resin derived from xylenol (A-1), and the novolac resin derived from xylenol (A-1) is formed by poly condensing an aldehyde compound with an aromatic hydroxyl compound, wherein the aromatic hydroxyl compound at least comprises a xylenol compound.

3. The positive photosensitive resin composition of claim 2, based on the novolac resin (A) as 100 parts by weight, an amount of the novolac resin derived from xylenol (A-1) is 2 parts by weight to 50 parts by weight.

4. The positive photosensitive resin composition of claim 1, based on the novolac resin (A) as 100 parts by weight, an amount of the ortho-naphthoquinone diazide sulfonic acid ester (C) is 5 parts by weight to 60 parts by weight, and an amount of the solvent (D) is 100 parts by weight to 1000 parts by weight.

5. The positive photosensitive resin composition of claim 1, based on the novolac resin (A) as 100 parts by weight, an amount of the polysiloxane (B) is 2 parts by weight to 15 parts by weight.

6. The positive photosensitive resin composition of claim 1, based on the novolac resin(A) as 100 parts by weight, an amount of the polysiloxane (B) is 3 parts by weight to 10 parts by weight.

7. A method for forming a pattern, and the method is subjecting a positive photosensitive resin composition to a coating process, a pre-bake process, an exposure process, a development process, and a post-bake process in sequence to form the pattern on a substrate, wherein the positive photosensitive resin composition comprising:

a novolac resin (A);

a polysiloxane (B), formed by polymerizing a compound having a structure of formula (I):

$Si(R_1)_a (OR_2)_{4-a}$ (I), wherein $R_1$ represents a hydrogen atom, an alkyl group of 1 to 10 carbons, an alkenyl group of 2-10 carbons, an aromatic group of 6 to 15 carbons, an alkyl group having an anhydride group, an alkyl group having an epoxy group, or an alkoxy group having an epoxy group and at least one of the $R_1$ comprimises an alkyl group having an anhydride group, an alkyl group having an epoxy group, or an alkoxy group having an epoxy group; $R_2$ represents a hydrogen atom, an alkyl group of 1 to 6 carbons, an acyl group of 1 to 6 carbons, or an aromatic group of 6 to 15 carbons; wherein a represents an integer of 1 to 3;

an ortho-naphthoquinone diazide sulfonic acid ester (C); and a solvent (D), wherein an amount of the polysiloxane (B) is 1 part by weight to 20 parts by weight based on 100 parts by weight of the novolac resin (A).

8. The method for forming a pattern of claim 7, wherein the novolac resin (A) includes a novolac resin derived from xylenol (A-1), and the novolac resin derived from xylenol (A-1) is formed by polycondensing an aldehyde compound with an aromatic hydroxy compound, wherein the aromatic hydroxy compound at least comprises a xylenol compound.

9. The method for forming a pattern of claim 8, based on the novolac resin (A) as 100 parts by weight, an amount of the novolac resin derived from xylenol (A-1) is 2 parts by weight to 50 parts by weight.

10. The method for forming a pattern of claim 7, based on the novolac resin (A) as 100 parts by weight, an amount of the ortho-naphthoquinone diazide sulfonic acid ester (C) is 5 parts by weight to 60 parts by weight, and an amount of the solvent (D) is 100 parts by weight to 1000 parts by weight.

11. The method for forming a pattern of claim 7, based on the novolac resin (A) as 100 parts by weight, an amount of the polysiloxane (B) is 2 parts by weight to 15 parts by weight.

12. The method for forming a pattern of claim 7, based on the novolac resin (A) as 100 parts by weight, an amount of the polysiloxane (B) is 3 parts by weight to 10 parts by weight.

* * * * *